(12) United States Patent
Khlat et al.

(10) Patent No.: US 12,640,646 B2
(45) Date of Patent: May 26, 2026

(54) FAST-SWITCHING POWER MANAGEMENT INTEGRATED CIRCUIT

(71) Applicant: Qorvo US, Inc., Greensboro, NC (US)

(72) Inventors: Nadim Khlat, Cugnaux (FR); Robert Moehrke, Winston-Salem, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 18/857,993

(22) PCT Filed: May 16, 2023

(86) PCT No.: PCT/US2023/022317
§ 371 (c)(1),
(2) Date: Oct. 18, 2024

(87) PCT Pub. No.: WO2023/244390
PCT Pub. Date: Dec. 21, 2023

(65) Prior Publication Data
US 2025/0274043 A1     Aug. 28, 2025

Related U.S. Application Data

(60) Provisional application No. 63/352,301, filed on Jun. 15, 2022.

(51) Int. Cl.
*H02M 3/155* (2006.01)
*H04B 1/40* (2015.01)
*H03F 3/24* (2006.01)

(52) U.S. Cl.
CPC .............. *H02M 3/155* (2013.01); *H04B 1/40* (2013.01); *H03F 3/245* (2013.01); *H03F 2200/451* (2013.01)

(58) Field of Classification Search
CPC ...................................................... H02M 3/155
(Continued)

(56) References Cited

U.S. PATENT DOCUMENTS 9,166,538 B2   10/2015   Hong et al.
10,784,823 B2    9/2020   Lehtola
(Continued)

OTHER PUBLICATIONS

International Search Report and Written Opinion for International Patent Application No. PCT/US2023/022317, mailed Sep. 8, 2023, 12 pages.

*Primary Examiner* — Tomi Skibinski
(74) *Attorney, Agent, or Firm* — Withrow & Terranova, P.L.L.C.

(57) ABSTRACT
A fast-switching power management integrated circuit (PMIC) is provided. The PMIC is configured to provide an average power tracking (APT) voltage to a power amplifier circuit for amplifying a radio frequency (RF) signal modulated in multiple time intervals. Herein, the PMIC is configured to increase or decrease the APT voltage from a present voltage level in a present one of the time intervals to a future voltage level in an upcoming one of the time intervals with very short switching interval (e.g., <20 nanoseconds). When the APT voltage transitions from the present voltage level to the future voltage level, the PMIC opportunistically activates a voltage amplifier to help ensure proper operation of the power amplifier circuit (e.g., maintain the APT voltage at the present level and reduce ripple in the APT voltage). As a result, the PMIC can switch the APT voltage frequently and rapidly with reduced inrush current.

29 Claims, 7 Drawing Sheets

(58) Field of Classification Search
USPC ......................................................... 327/540
See application file for complete search history.

(56) References Cited

U.S. PATENT DOCUMENTS

| 10,985,713 | B2 | 4/2021 | Patchin et al. |
| 2020/0336111 | A1 | 10/2020 | Khlat |
| 2022/0224364 | A1* | 7/2022 | Kim ......................... H04B 1/04 |

\* cited by examiner

FAST-SWITCHING POWER MANAGEMENT INTEGRATED CIRCUIT

RELATED APPLICATIONS

This application is a 35 USC 371 national phase filing of International Application No. PCT/US2023/022317, filed May 16, 2023, which claims the benefit of U.S. provisional patent application Ser. No. 63/352,301, filed on Jun. 15, 2022, the disclosures of which are incorporated herein by reference in their entireties.

FIELD OF THE DISCLOSURE

The technology of the disclosure relates generally to a power management integrated circuit (PMIC).

BACKGROUND

Fifth-generation (5G) new radio (NR) (5G-NR) has been widely regarded as the next generation of wireless communication technology beyond the current third-generation (3G) and fourth-generation (4G) technologies. In this regard, a wireless communication device capable of supporting the 5G-NR wireless communication technology is expected to achieve higher data rates, improved coverage range, enhanced signaling efficiency, and reduced latency across a wide range of radio frequency (RF) bands, which include a low-band (below 1 GHZ), a mid-band (1 GHz to 6 GHZ), and a high-band (above 24 GHZ).

Downlink and uplink transmissions in a 5G-NR system are widely based on orthogonal frequency division multiplexing (OFDM). In this regard, FIG. 1 is a schematic diagram of an exemplary OFDM time-frequency grid 10 illustrating at least one resource block (RB) 12 for physical resource allocation in the 5G-NR system. The OFDM time-frequency grid 10 includes a frequency axis 14 representing a frequency domain and a time axis 16 representing a time domain. Along the frequency axis 14, there are multiple subcarriers 18(1)-18(M). The subcarriers 18(1)-18(M) are orthogonally separated from each other by a subcarrier spacing (SCS) (e.g., 15 KHz). Along the time axis 16, there are multiple OFDM symbols 20(1)-20(N). The OFDM symbols 20(1)-20(N) may be modulated either as data symbols to carry data payload and/or reference symbols to carry such reference signals as demodulation reference signals (DMRS), sounding reference signals (SRS), and so on. Each of the OFDM symbols 20(1)-20(N) is separated by a cyclic prefix (CP) (not shown) configured to act as a guard band to help overcome inter-symbol interference (ISI) between the OFDM symbols 20(1)-20(N). In the OFDM time-frequency grid 10, each intersection of the subcarriers 18(1)-18M) and the OFDM symbols 20(1)-20(N) defines a resource element (RE) 22.

In a 5G-NR communication system, an RF signal can be modulated into multiple subcarriers among the subcarriers 18(1)-18(N) in the frequency domain (along the frequency axis 14) and multiple OFDM symbols among the OFDM symbols 20(1)-20(N) in the time domain (along the time axis 16). The table (Table 1) below summarizes OFDM configurations supported by the 5G-NR communication system.

TABLE 1

| SCS (KHz) | Slot Length (µs) | # of Slots per Subframe | CP (µs) | OFDM Symbol Duration (µs) | Modulation Bandwidth (MHz) |
|---|---|---|---|---|---|
| 15 | 1000 | 1 | 4.69 | 71.43 | 50 |
| 30 | 500 | 2 | 2.34 | 35.71 | 100 |
| 60 | 250 | 4 | 1.17 | 17.86 | 200 |
| 120 | 125 | 8 | 0.59 | 8.93 | 400 |

In the 5G-NR communication system, the RF signal is typically modulated with a high modulation bandwidth in excess of 200 MHz. In this regard, according to Table 1, the SCS will be 120 KHz and a transition settling time between two consecutive OFDM symbols among the OFDM symbols 20(1)-20(N) (e.g., amplitude change of the RF signal) needs to be less than or equal to the CP duration of 0.59 µs.

In addition, the wireless communication device may also need to support such internet-of-things (IoT) applications as keyless car entry, remote garage door opening, contactless payment, mobile boarding pass, and so on. Needless to say, the wireless communication device must also always make 911/E911 service accessible under emergency situations. As such, it is critical that the wireless communication device remains operable whenever needed.

Notably, the wireless communication device relies on a battery cell (e.g., Li-Ion battery) to power its operations and services. Despite recent advancement in battery technologies, the wireless communication device can run into a low battery situation from time to time. In this regard, it is desirable to prolong battery life concurrent to enabling fast voltage changes between the OFDM symbols 20(1)-20(N).

SUMMARY

Embodiments of the disclosure relate to a fast-switching power management integrated circuit (PMIC). The PMIC is configured to provide an average power tracking (APT) voltage to a power amplifier circuit for amplifying a radio frequency (RF) signal modulated in multiple time intervals. Herein, the PMIC is configured to increase or decrease the APT voltage from a present voltage level in a present one of the time intervals to a future voltage level in an upcoming one of the time intervals with a very short switching interval (e.g., <20 nanoseconds). When the APT voltage transitions from the present voltage level to the future voltage level, the PMIC opportunistically activates a voltage amplifier to help ensure proper operation of the power amplifier circuit (e.g., maintain the APT voltage at the present level and reduce ripple in the APT voltage). As a result, the PMIC can switch the APT voltage frequently and rapidly with reduced inrush current.

In one aspect, a PMIC is provided. The PMIC includes a voltage output that outputs an APT voltage to a power amplifier circuit for amplifying an RF signal modulated in a plurality of modulation units each comprising a plurality of time intervals. The PMIC also includes an offset circuit. The offset circuit is coupled to the voltage output and configured to change the APT voltage from a present voltage level in a present time interval among the plurality of time intervals to a future voltage level in an upcoming time interval among the plurality of time intervals during a transition interval that falls within one of the present time interval and the upcoming time interval. The PMIC also includes a voltage amplifier. The voltage amplifier is coupled to an input of the offset circuit. The voltage amplifier is activated at a start of the transition interval and deactivated at an end of the transition interval to generate a modulated voltage at the input of the offset circuit based on an amplifier target voltage determined to cause the modulated voltage to be higher than or equal to a headroom voltage at the end of the transition interval.

In another aspect, a wireless communication circuit is provided. The wireless communication circuit includes a PMIC. The PMIC includes a voltage output that outputs an APT voltage for amplifying an RF signal modulated in a plurality of modulation units each comprising a plurality of time intervals. The PMIC also includes an offset circuit. The offset circuit is coupled to the voltage output and configured to change the APT voltage from a present voltage level in a present time interval among the plurality of time intervals to a future voltage level in an upcoming time interval among the plurality of time intervals during a transition interval that falls within one of the present time interval and the upcoming time interval. The PMIC also includes a voltage amplifier. The voltage amplifier is coupled to an input of the offset circuit. The voltage amplifier is activated at a start of the transition interval and deactivated at an end of the transition interval to generate a modulated voltage at the input of the offset circuit based on an amplifier target voltage determined to cause the modulated voltage to be higher than or equal to a headroom voltage at the end of the transition interval.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
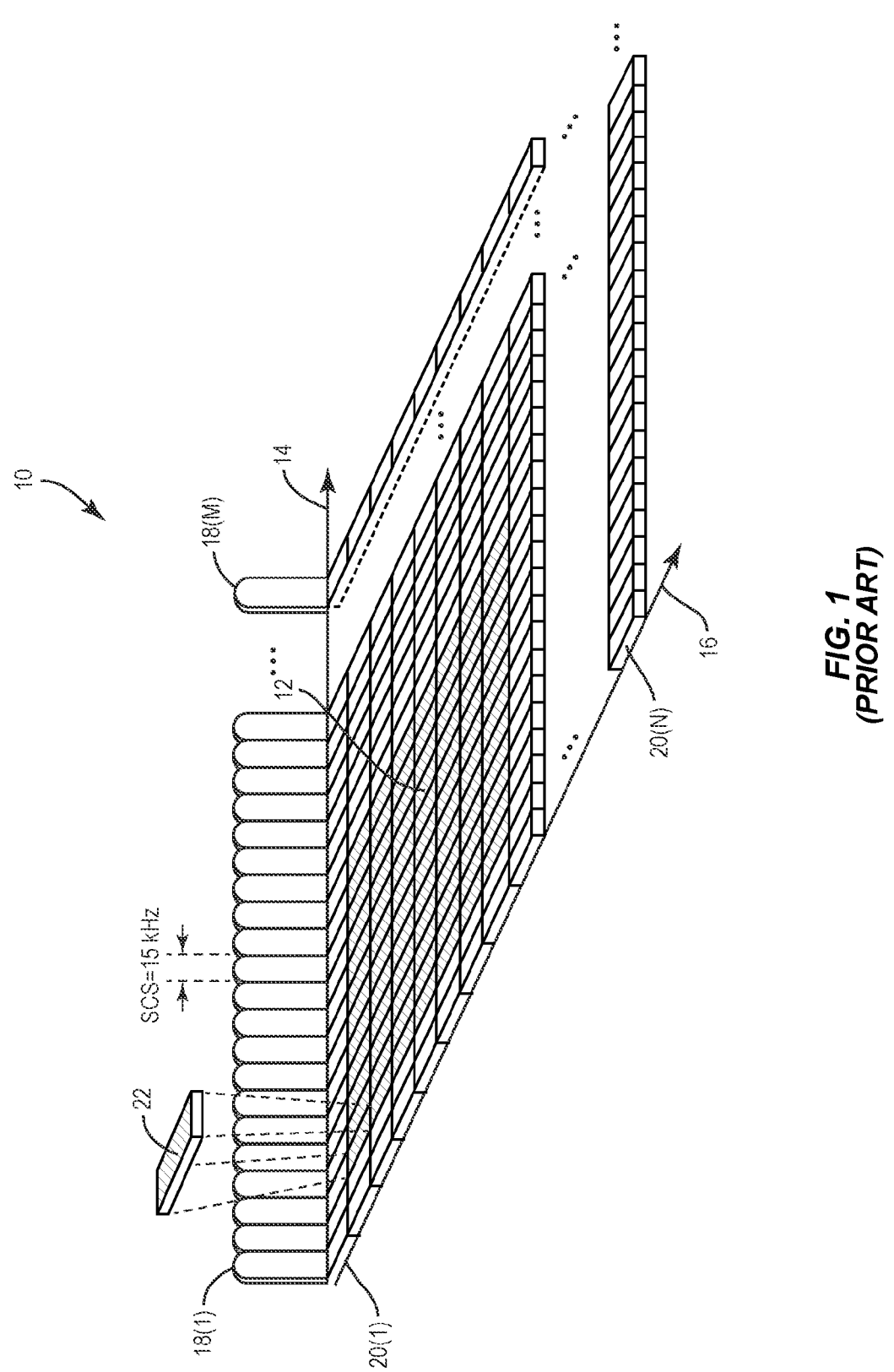
FIG. 1 is a schematic diagram of an exemplary orthogonal frequency division multiplexing (OFDM) time-frequency grid illustrating at least one resource block (RB) for physical resource allocation.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a fast-switching power management integrated circuit (PMIC). The PMIC is configured to provide an average power tracking (APT) voltage to a power amplifier circuit for amplifying a radio frequency (RF) signal modulated in multiple time intervals. Herein, the PMIC is configured to increase or decrease the APT voltage from a present voltage level in a present one of the time intervals to a future voltage level in an upcoming one of the time intervals with a very short switching interval (e.g., <20 nanoseconds). When the APT voltage transitions from the present voltage level to the future voltage level, the PMIC opportunistically activates a voltage amplifier to help ensure proper operation of the power amplifier circuit (e.g., maintain the APT voltage at the present level and reduce ripple in the APT voltage). As a result, the PMIC can switch the APT voltage frequently and rapidly with reduced inrush current.

Figure 2:
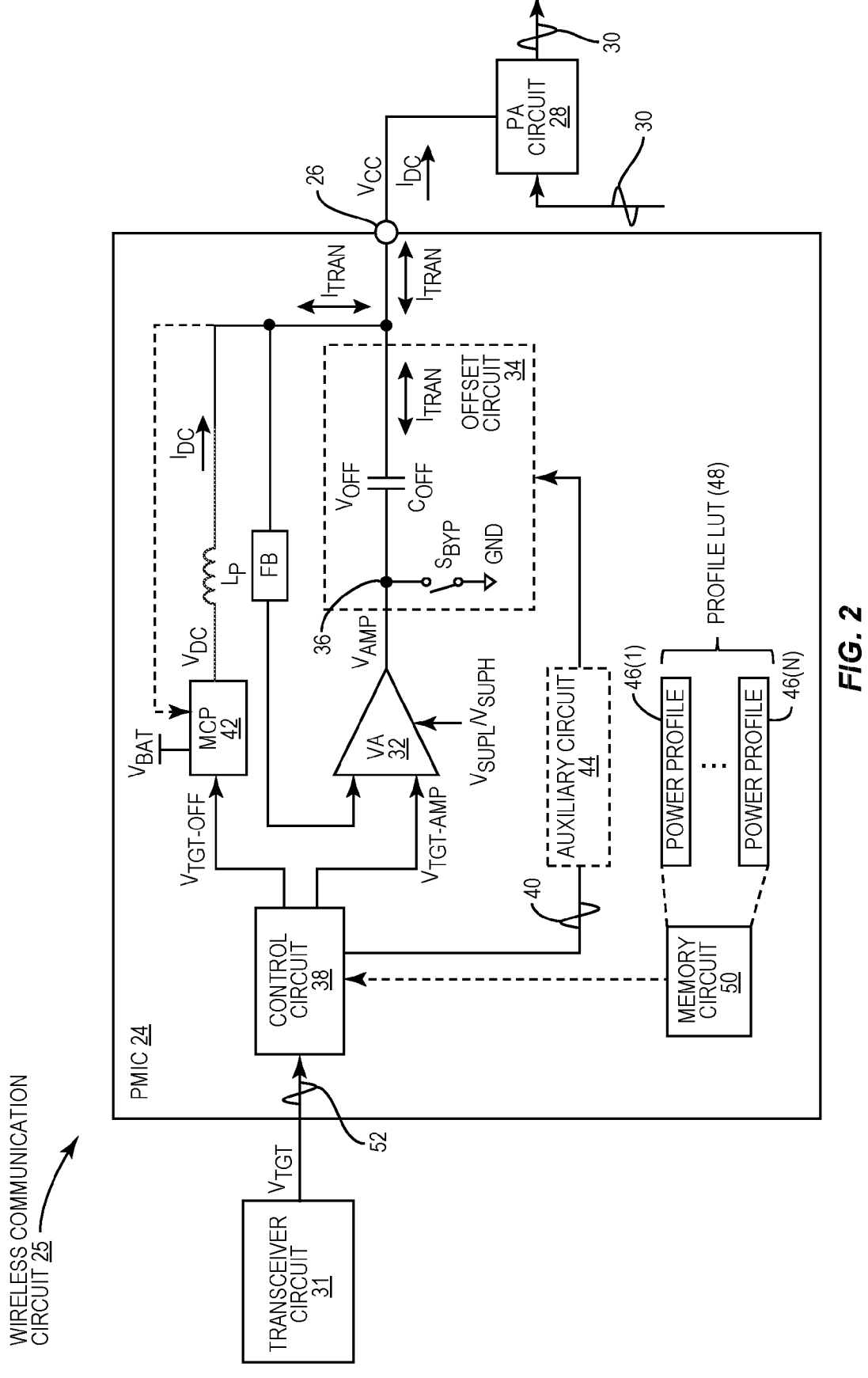
FIG. 2 is a schematic diagram of an exemplary power management integrated circuit (PMIC) configured according to embodiments of the present disclosure to support fast average power tracking (APT) voltage switching.

In this regard, FIG. 2 is a schematic diagram of an exemplary PMIC 24, which is provided in a wireless communication circuit 25 and configured according to embodiments of the present disclosure to support fast APT voltage switching. The PMIC 24 includes a voltage output 26 that outputs an APT voltage $V_{CC}$ to a power amplifier circuit 28 in the wireless communication circuit 25. The power amplifier circuit 28 is configured to amplify an RF signal 30 based on the APT voltage $V_{CC}$. The RF signal 30, which may be generated by a transceiver circuit 31 in the wireless communication circuit 25, is modulated in multiple modulation units, each of which is further divided into multiple time intervals. In the context of the present disclosure, the modulation units are equivalent to time-division duplex (TDD) time slots or mini time slots, and the time intervals inside each of the modulation units are equivalent to orthogonal frequency division multiplexing (OFDM) symbols, such as the OFDM symbols 20(1)-20(N) in FIG. 1. In this regard, each of the time intervals can be modulated to carry a data payload (referred herein as "a data symbol") and a reference signal (referred herein as "a reference symbol"), such as a demodulation reference signal (DMRS), a sounding reference signal (SRS), and so on.

Given that the power amplifier circuit 28 needs to amplify the data symbols and the reference symbols to different power levels, the PMIC 24 may need to adapt (increase or decrease) the APT voltage $V_{CC}$ on a per-symbol basis. Moreover, as previously described in FIG. 1, the PMIC 24 must complete the APT voltage $V_{CC}$ within the respective cyclic prefix (CP) in each of the OFDM symbols 20(1)-20(N).

The PMIC 24 includes a voltage amplifier 32 (denoted as "VA") and an offset circuit 34. The voltage amplifier 32 is coupled to an input 36 of the offset circuit 34 and the offset circuit 34 is coupled to the voltage output 26. In the context of the present disclosure, the power amplifier circuit 28 is assumed to have a much higher bandwidth than that of the offset circuit 34. As described in detail below, the offset circuit 34 is configured to change (increase or decrease) the APT voltage $V_{CC}$ from a present voltage level (denoted as "$V_{CC(N-1)}$" in FIGS. 3 to 5) to a future voltage level (denoted as "$V_{CC(N)}$" in FIGS. 3 to 5) between a pair of adjacent time intervals (denoted as "$S_{N-1}$" and "$S_N$" in FIGS. 3 to 5). For the sake of distinction, the time intervals $S_{N-1}$ and $S_N$ are also referred to as a "present time interval" and an "upcoming time interval," respectively.

Figure 3:
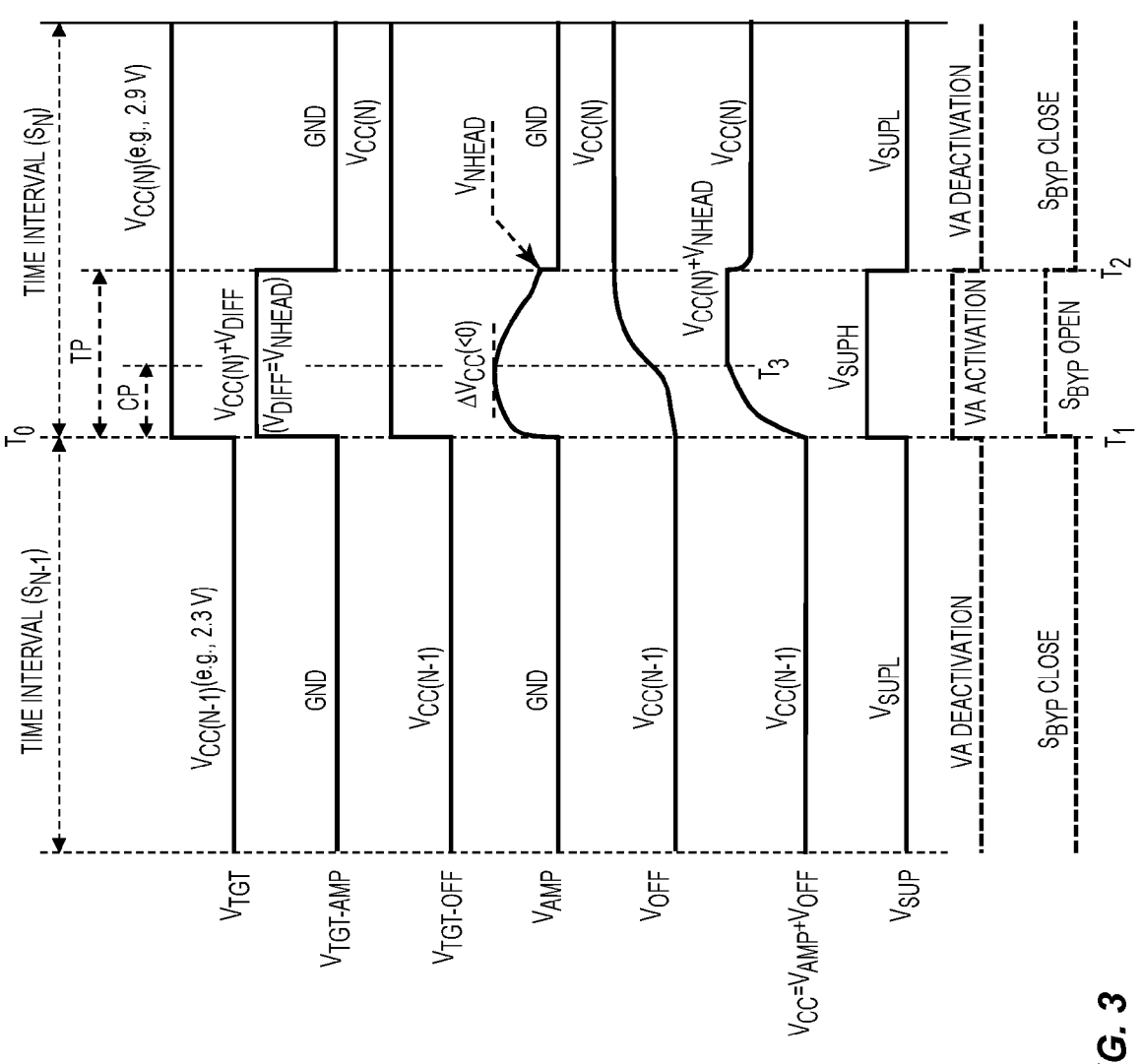
FIG. 3 is a timing diagram providing an exemplary illustration of the PMIC of FIG. 2 configured according to an embodiment of the present disclosure to increase the APT voltage from a present voltage level to a future voltage level.
Figure 4:
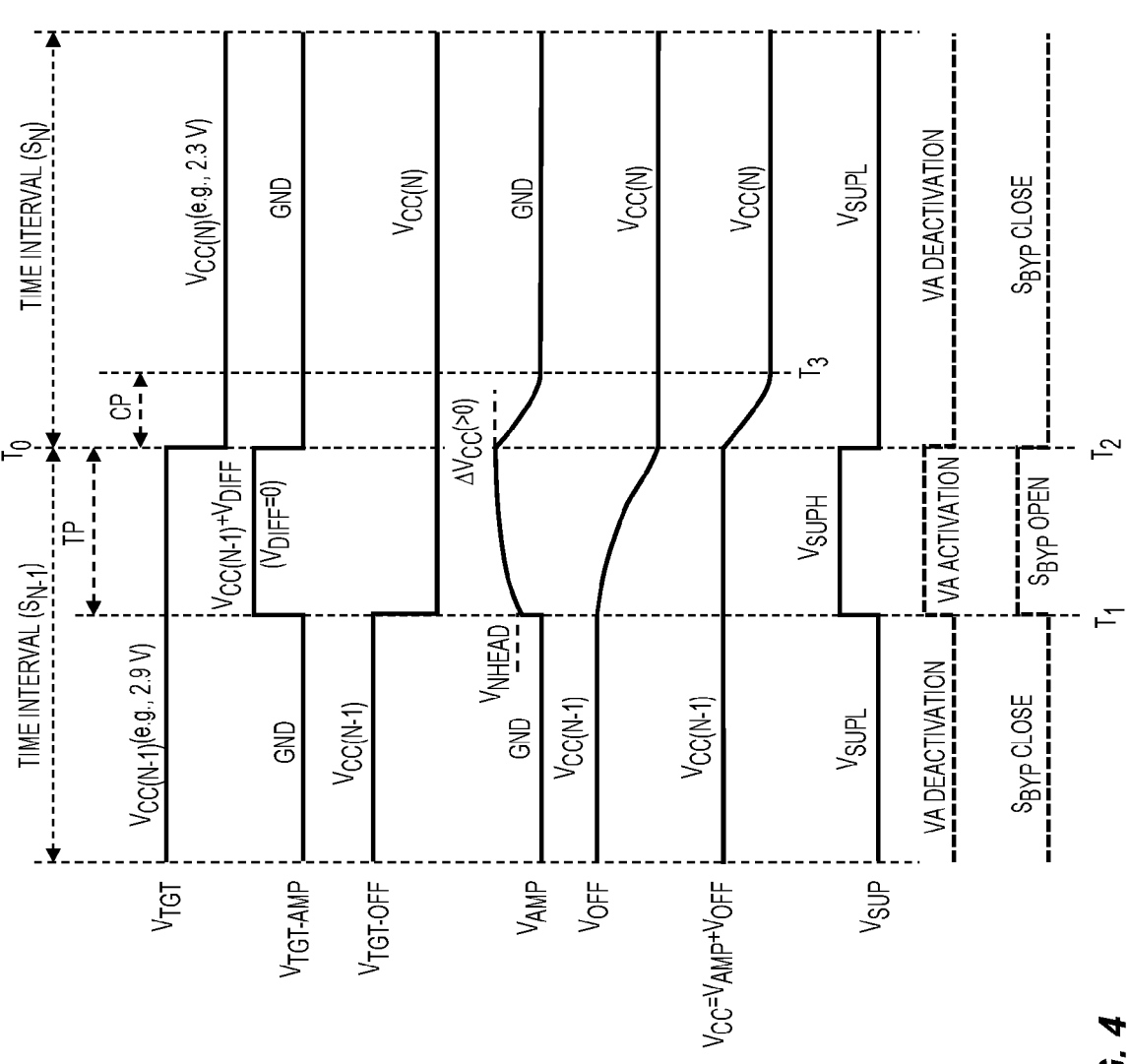
FIG. 4 is a timing diagram providing an exemplary illustration of the PMIC of FIG. 2 configured according to an embodiment of the present disclosure to decrease the APT voltage from a present voltage level to a future voltage level.
Figure 5:
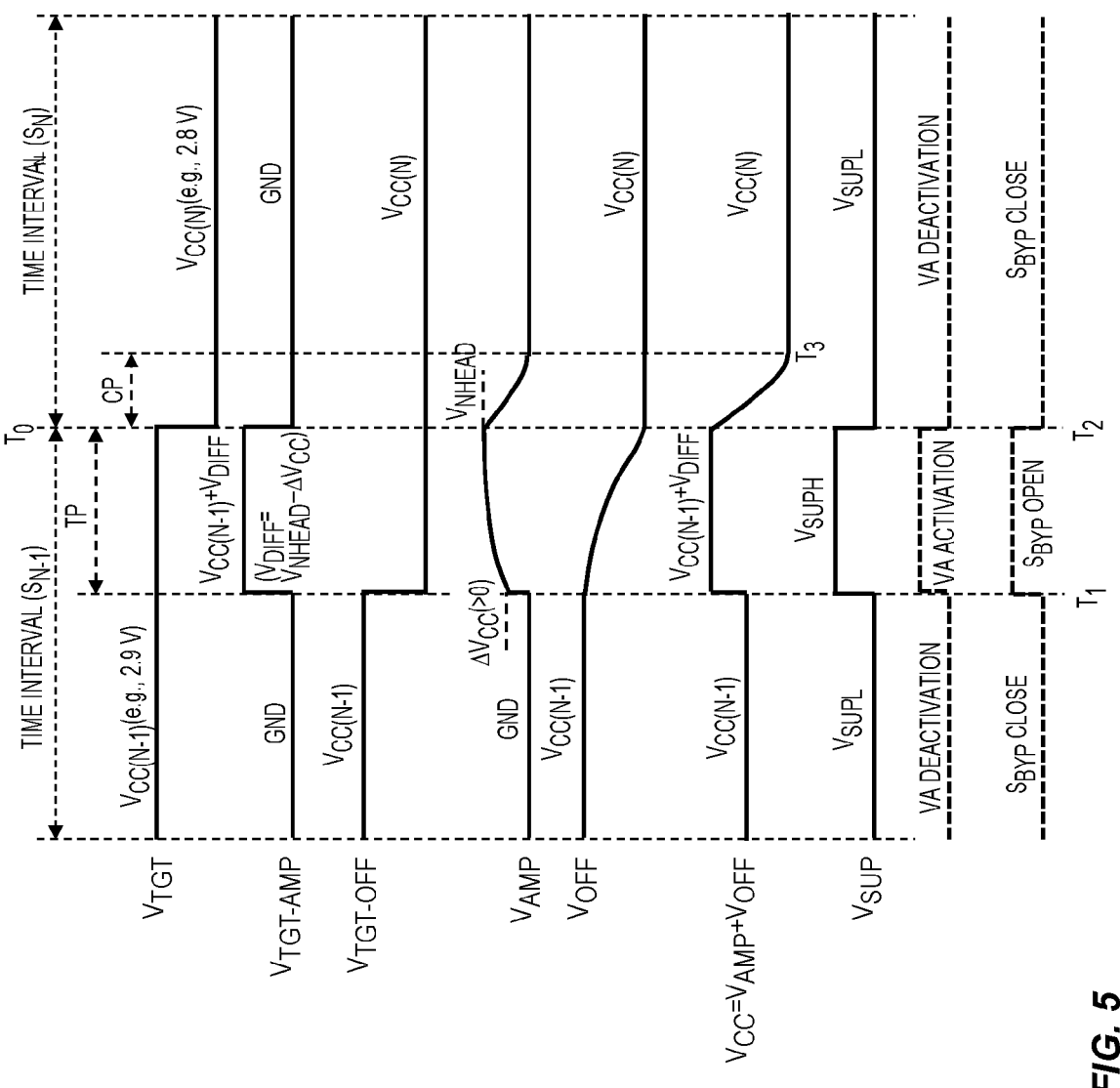
FIG. 5 is a timing diagram providing an exemplary illustration of the PMIC of FIG. 2 configured according to another embodiment of the present disclosure to decrease the APT voltage from a present voltage level to a future voltage level.

More specifically, the offset circuit 34 will cause the APT voltage $V_{CC}$ to change from the present voltage level $V_{CC(N-1)}$ in the present time interval $S_{N-1}$ to the future voltage level $V_{CC(N)}$ in the upcoming time interval $S_N$ during a transition interval (denoted as "TP" in FIGS. 3 to 5). Depending on whether the APT voltage $V_{CC}$ is increasing or decreasing from the present time interval $S_{N-1}$ to the upcoming time interval $S_N$, the transition interval TP can be located either in the present time interval $S_{N-1}$ or in the upcoming time interval $S_N$ to ensure that the APT voltage $V_{CC}$ can reach the future voltage level $V_{CC(N)}$ by the CP of the upcoming time interval $S_N$.

As further illustrated in FIGS. 3 to 5, while the APT voltage $V_{CC}$ transitions from the present voltage level $V_{CC(N-1)}$ to the future voltage level $V_{CC(N)}$ during the transition interval TP, the voltage amplifier 32 is activated at a start of the transition interval TP (denoted as "$T_1$") and deactivated at an end of the transition interval TP (denoted as "$T_2$") to ensure proper operation of the power amplifier circuit 28. According to an embodiment of the present disclosure, the voltage amplifier 32 will provide a modulated voltage $V_{AMP}$ at an input 36 of the offset circuit 34. In a non-limiting example, the voltage amplifier 32 is configured to generate the modulated voltage $V_{AMP}$ based on an amplifier target voltage $V_{TGT-AMP}$ and one of a lower supply voltage $V_{SUPL}$ and a higher supply voltage $V_{SUPH}$ ($V_{SUPH} > V_{SUPL}$).

As discussed in detailed examples in FIGS. 3 to 5, the amplifier target voltage $V_{TGT-AMP}$ is so determined to ensure that the voltage amplifier 32 can maintain the modulated voltage $V_{AMP}$ at or above a headroom voltage (denoted as "$V_{NHEAD}$" in FIGS. 3 to 5), which is greater than 0 V, at the end $T_2$ of the transition interval TP. As a result, the voltage amplifier 32 can maintain the APT voltage $V_{CC}$ at the present voltage level $V_{CC(N-1)}$ and suppress ripple in the APT voltage $V_{CC}$ during the transition interval TP to thereby ensure the proper operation of the power amplifier circuit 28 during the transition interval TP.

According to an embodiment of the present disclosure, the PMIC 24 can include a control circuit 38, which can be a field-programmable gate array (FPGA) or an application-specific integrated circuit (ASIC), as an example. In one aspect, the control circuit 38 may be configured to determine whether the transition interval TP should be within the present time interval $S_{N-1}$ or the upcoming time interval $S_N$ based on a differential $\Delta V_{CC}$ between the present voltage level $V_{CC(N-1)}$ and the future voltage level $V_{CC(N)}$ ($\Delta V_{CC} = V_{CC(N-1)} - V_{CC(N)}$). Understandably, the differential $\Delta V_{CC}$ will be positive when the present voltage level $V_{CC(N-1)}$ is higher than the future voltage level $V_{CC(N)}$ or negative when the present voltage level $V_{CC(N-1)}$ is lower than the future voltage level $V_{CC(N)}$. In a non-limiting example, the control circuit 38 can receive a modulated target voltage $V_{TGT}$, which indicates the future voltage level $V_{CC(N)}$ in the upcoming time interval $S_N$, from the transceiver circuit 31. Accordingly, the control circuit 38 may control the offset circuit 34 (e.g., via a control signal 40) to transition from the present voltage level $V_{CC(N-1)}$ to the future voltage level $V_{CC(N)}$ during the transition interval TP.

In another aspect, the control circuit 38 may also be configured to determine the amplifier target voltage $V_{TGT-AMP}$ based on the determined differential $\Delta V_{CC}$. In a non-limiting example, when the future voltage level $V_{CC(N)}$ is higher than the present voltage level $V_{CC(N-1)}$, as illustrated in FIG. 3, the amplifier target voltage $V_{TGT-AMP}$ is equal to a sum of the future voltage level $V_{CC(N)}$ and a markup voltage (denoted as "$V_{DIFF}$"), as shown in equation (Eq. 1) below. In another non-limiting example, when the future voltage level $V_{CC(N)}$ is lower than the present voltage level $V_{CC(N-1)}$, as illustrated in FIGS. 4 and 5, the amplifier target voltage $V_{TGT-AMP}$ is equal to a sum of the present voltage level $V_{CC(N-1)}$ and the markup voltage $V_{DIFF}$, as shown in equation (Eq. 2) below.

$$V_{TGT-AMP} = V_{CC(N)} + V_{DIFF} \qquad \text{(Eq. 1)}$$

$$V_{TGT-AMP} = V_{CC(N-1)} + V_{DIFF} \qquad \text{(Eq. 2)}$$

In the equations (Eq. 1 and Eq. 2), the markup voltage $V_{DIFF}$ can be of different values depending on how the APT voltage $V_{CC}$ will change from the present time interval $S_{N-1}$ to the upcoming time interval $S_N$. In this regard, by changing the amplifier target voltage $V_{TGT-AMP}$ and, more specifically the markup voltage $V_{DIFF}$, the control circuit 38 can cause the voltage amplifier 32 to generate the modulated voltage $V_{AMP}$ at appropriate levels during the transition interval TP to maintain proper operation of the power amplifier circuit 28.

In yet another aspect, the control circuit 38 may be further configured to activate the voltage amplifier 32 at the start $T_1$ of the transition interval TP and deactivate the voltage amplifier 32 at the end $T_2$ of the transition interval TP. In a non-limiting example, the control circuit 38 can cause the voltage amplifier 32 to be deactivated in response to receiving the lower supply voltage $V_{SUPL}$ or activated in response to receiving the higher supply voltage $V_{SUPH}$. By controlling the offset circuit 34 to change the APT voltage $V_{CC}$ and opportunistically activating/deactivating the voltage amplifier 32 to ensure proper operation of the power amplifier circuit 28 during the transition interval TP, the PMIC 24 can switch the APT voltage $V_{CC}$ efficiently under the increasingly stringent switching time requirements (e.g., <20 ns).

The PMIC 24 also includes a multi-level charge pump (MCP) 42. The MCP 42, which may be a direct current (DC)-DC buck-boost converter, is configured to generate a low-frequency voltage $V_{DC}$ (e.g., DC voltage) based on a battery voltage $V_{BAT}$. Specifically, the MCP 42 may operate in a buck mode to generate the low-frequency voltage $V_{DC}$ at $0 \times V_{BAT}$ or $1 \times V_{BAT}$, or in a boost mode to generate the low-frequency voltage $V_{DC}$ at $2 \times V_{BAT}$. The MCP 42 may be configured to toggle between the buck mode and the boost mode based on a particular duty cycle (e.g., 20% @$0 \times V_{BAT}$, 30% @$1 \times V_{BAT}$, and 50% @$2 \times V_{BAT}$). As such, the MCP 42 may be controlled to generate the low-frequency voltage $V_{DC}$ at a desired level.

In an embodiment, the control circuit 38 may be further configured to generate an offset target voltage $V_{TGT-OFF}$ based on the modulated target voltage $V_{TGT}$. The offset target voltage $V_{TGT-OFF}$ may indicate the future voltage level $V_{CC(N)}$ of the APT voltage $V_{CC}$. Accordingly, the MCP 42 may determine and operate based on a corresponding duty cycle to generate the low-frequency voltage $V_{DC}$ at the desired level as indicated by the offset target voltage $V_{TGT-OFF}$.

The PMIC 24 also includes a power inductor $L_P$. The power inductor $L_P$ is coupled between the MCP 42 and the voltage output 26 and is configured to induce a low-frequency current $I_{DC}$ (e.g., a DC current) based on the low-frequency voltage $V_{DC}$. Understandably, the low-frequency current $I_{DC}$ that may be induced is a function of the low-frequency voltage $V_{DC}$ and an inductance of the power inductor $L_P$. Accordingly, the control circuit 38 may further change the low-frequency current $I_{DC}$ based on the offset target voltage $V_{TGT-OFF}$. In an embodiment, the MCP 42 may receive feedback from the APT voltage $V_{CC}$.

Herein, the offset circuit 34 includes an offset capacitor $C_{OFF}$ and a bypass switch $S_{BYP}$. The offset capacitor $C_{OFF}$ is coupled between the input 36 and the voltage output 26, and the bypass switch $S_{BYP}$ is coupled between the input 36 and a ground (GND).

Under one operating scenario, the APT voltage $V_{CC}$ is set to increase from the present voltage level $V_{CC(N-1)}$ in the present time interval $S_{N-1}$ to the future voltage level $V_{CC(N)}$ in the upcoming time interval $S_N$ ($V_{CC(N-1)} < V_{CC(N)}$). In this regard, the control circuit 38 will set the offset target voltage $V_{TGT-OFF}$ to the future voltage level $V_{CC(N)}$ of the APT voltage $V_{CC}$ to cause the low-frequency current $I_{DC}$ to be generated at a desired amount to thereby charge the offset capacitor $C_{OFF}$ to the future voltage level $V_{CC(N)}$.

The control circuit 38 will open the bypass switch $S_{BYP}$ and activate the voltage amplifier 32 at the start of the transition interval TP to generate the amplifier target voltage $V_{TGT-AMP}$ at a level higher than the future voltage level $V_{CC(N)}$ such that a current $I_{TRAN}$ can flow from the MCP 42 through the offset capacitor $C_{OFF}$ and sink in the voltage amplifier 32. In a non-limiting example, the PMIC 24 can include an auxiliary circuit 44, which can provide additional current to help maintain the modulated voltage $V_{AMP}$ in the presence of the current $I_{TRAN}$. As a result, the current $I_{TRAN}$ will gradually charge the offset capacitor $C_{OFF}$ to the future voltage level $V_{CC(N)}$ during the transition interval TP. When the offset capacitor $C_{OFF}$ is charged up to the future voltage level $V_{CC(N)}$ at the end of the transition interval TP, the control circuit 38 deactivates the voltage amplifier 32 and closes the bypass switch $S_{BYP}$. Thereafter, the offset capacitor $C_{OFF}$ and the MCP 42 will maintain the APT voltage $V_{CC}$ at the future voltage level $V_{CC(N)}$ in the remainder of the upcoming time interval $S_N$.

The operating scenario described above can be graphically illustrated in FIG. 3. FIG. 3 is a timing diagram providing an exemplary illustration as to how the PMIC 24 of FIG. 2 operates under the above-described operating scenario to increase the APT voltage $V_{CC}$. Elements in FIG. 2 are referenced in FIG. 3 and will not be re-described herein.

As illustrated, the transition interval TP falls completely within the upcoming time interval $S_N$, wherein the start $T_1$ of the transition interval TP is aligned with a boundary $T_0$ (a.k.a. a starting time of the CP in the upcoming time interval $S_N$) between the present time interval $S_{N-1}$ and the upcoming time interval $S_N$, and the end $T_2$ of the transition interval TP comes after time $T_3$ (a.k.a. an ending time of the CP in the upcoming time interval $S_N$). Understandably, the CP is typically much shorter than the transition interval TP. Herein, the modulated target voltage $V_{TGT}$ indicates that the APT voltage $V_{CC}$ will increase from the present voltage level $V_{CC(N-1)}$ (e.g., 2.3 V) in the present time interval $S_{N-1}$ to the future voltage level $V_{CC(N)}$ (e.g., 2.9 V) in the upcoming time interval $S_N$. Accordingly, the control circuit 38 determines the offset target voltage $V_{TGT-OFF}$ to be equal to the future voltage level $V_{CC(N)}$.

As for the amplifier target voltage $V_{TGT-AMP}$, the control circuit 38 is configured to set the markup voltage $V_{DIFF}$ in the equation (Eq. 1) to be equal to the headroom voltage $V_{NHEAD}$ ($V_{TGT-AMP} = V_{CC(N)} + V_{NHEAD}$). At time $T_1$, the control circuit 38 opens the bypass switch $S_{BYP}$ and activates the voltage amplifier 32 (e.g., by coupling the higher supply voltage $V_{SUPH}$ to the voltage amplifier 32). Accordingly, the voltage amplifier 32 will generate the modulated voltage $V_{AMP}$ at the input 36 in accordance with the amplifier target voltage $V_{TGT-AMP}$. In a non-limiting example, the voltage amplifier 32, with assistance from the auxiliary circuit 44, can quickly drive the modulated voltage $V_{AMP}$ from a GND level to the differential $\Delta V_{CC}$ ($\Delta V_{CC}$<0) at time $T_3$ to help stabilize the APT voltage $V_{CC}$ during the transition interval TP. Thereafter, the voltage amplifier 32 gradually decreases the modulated voltage $V_{AMP}$ to the headroom voltage $V_{NHEAD}$ at time $T_2$.

Starting at time $T_1$, the offset capacitor $C_{OFF}$ is gradually charged up to reach the future voltage level $V_{CC(N)}$ at time $T_2$. Accordingly, at time $T_2$, the control circuit 38 closes the bypass switch $S_{BYP}$ and deactivates the voltage amplifier 32 to let the modulated voltage $V_{AMP}$ return to the GND level. The APT voltage $V_{CC}$, which equals a sum of the modulated voltage $V_{AMP}$ and the offset voltage $V_{OFF}$, will settle at the future voltage level $V_{CC(N)}$ at time $T_3$. Notably, since the voltage amplifier 32 maintains the modulated voltage $V_{AMP}$ at or above the headroom voltage $V_{NHEAD}$ while the bypass switch $S_{BYP}$ is toggled, the APT voltage $V_{CC}$ will not drop below the headroom voltage $V_{NHEAD}$, thus ensuring proper operation of the power amplifier circuit 28.

With reference back to FIG. 2, under another operating scenario, the APT voltage $V_{CC}$ is set to decrease from the present voltage level $V_{CC(N-1)}$ in the present time interval $S_{N-1}$ to the future voltage level $V_{CC(N)}$ in the upcoming time interval $S_N$ ($V_{CC(N-1)}$>$V_{CC(N)}$). In this regard, the control circuit 38 will set the offset target voltage $V_{TGT-OFF}$ to the future voltage level $V_{CC(N)}$ of the APT voltage $V_{CC}$ to cause the low-frequency current $I_{DC}$ to be generated at a desired amount to thereby cause the offset capacitor $C_{OFF}$ to be discharged to the future voltage level $V_{CC(N)}$.

The control circuit 38 will open the bypass switch $S_{BYP}$ and activate the voltage amplifier 32 at the start of the transition interval TP to generate the amplifier target voltage $V_{TGT-AMP}$ at the present voltage level $V_{CC(N-1)}$ such that the current $I_{TRAN}$ can flow from the voltage amplifier 32 through the offset capacitor $C_{OFF}$ and return to the MCP 42 and/or the power amplifier circuit 28. In a non-limiting example, the auxiliary circuit 44 can provide additional current to help maintain the modulated voltage $V_{AMP}$ in the presence of the current $I_{TRAN}$. As a result, the offset capacitor $C_{OFF}$ will be gradually discharged to the future voltage level $V_{CC(N)}$ during the transition interval TP. When the offset capacitor $C_{OFF}$ is discharged to the future voltage level $V_{CC(N)}$ at the end of the transition interval TP, the control circuit 38 deactivates the voltage amplifier 32 and closes the bypass switch $S_{BYP}$. Thereafter, the offset capacitor $C_{OFF}$ and the MCP 42 will maintain the APT voltage $V_{CC}$ at the future voltage level $V_{CC(N)}$ in the remainder of the upcoming time interval $S_N$.

The operating scenario described above can be graphically illustrated in FIGS. 4 and 5. FIG. 4 is a timing diagram providing an exemplary illustration as to how the PMIC 24 of FIG. 2 operates under one possibility of the above-described operating scenario to decrease the APT voltage $V_{CC}$. More specifically, FIG. 4 illustrates a situation where the headroom voltage $V_{NHEAD}$ (e.g., 0.4 V) is lower than the differential $\Delta V_{CC}$ (e.g., 0.6 V) between the present voltage level $V_{CC(N-1)}$ and the future voltage level $V_{CC(N)}$ ($V_{NHEAD}$<$\Delta V_{CC}$). Elements in FIG. 2 are referenced in FIG. 4 and will not be re-described herein.

As illustrated, the transition interval TP falls completely within the present time interval $S_{N-1}$, wherein the start $T_1$ of the transition interval TP begins prior to a boundary $T_0$ between the present time interval $S_{N-1}$ and the upcoming time interval $S_N$, and the end $T_2$ of the transition interval TP is aligned with the boundary $T_0$ (a.k.a. a starting time of the CP in the upcoming time interval $S_N$). Understandably, the CP is typically much shorter than the transition interval TP. Herein, the modulated target voltage $V_{TGT}$ indicates that the APT voltage $V_{CC}$ will decrease from the present voltage level $V_{CC(N-1)}$ (e.g., 2.9 V) in the present time interval $S_{N-1}$ to the future voltage level $V_{CC(N)}$ (e.g., 2.3 V) in the upcoming time interval $S_N$. Accordingly, the control circuit 38 determines the offset target voltage $V_{TGT-OFF}$ to be equal to the future voltage level $V_{CC(N)}$.

As for the amplifier target voltage $V_{TGT-AMP}$, the control circuit 38 is configured to set the markup voltage $V_{DIFF}$ in the equation (Eq. 2) to 0 V ($V_{TGT-AMP}$=$V_{CC(N-1)}$+0). At time $T_1$, the control circuit 38 opens the bypass switch $S_{BYP}$ and activates the voltage amplifier 32 (e.g., by coupling the higher supply voltage $V_{SUPH}$ to the voltage amplifier 32). Accordingly, the voltage amplifier 32 will generate the modulated voltage $V_{AMP}$ at the input 36 in accordance with the amplifier target voltage $V_{TGT-AMP}$. In a non-limiting example, the voltage amplifier 32, with assistance from the auxiliary circuit 44, can instantly drive the modulated voltage $V_{AMP}$ from a GND level to the headroom voltage $V_{NHEAD}$ at time $T_1$. Thereafter, the voltage amplifier 32 will continue to drive the modulated voltage $V_{AMP}$ up to the voltage differential $\Delta V_{CC}$ at time $T_2$.

Starting at time $T_1$, the offset capacitor $C_{OFF}$ is gradually discharged to reach the future voltage level $V_{CC(N)}$ at time $T_2$. Accordingly, at time $T_2$, the control circuit 38 closes the bypass switch $S_{BYP}$ and deactivates the voltage amplifier 32 to let the modulated voltage $V_{AMP}$ return to the GND level at time $T_3$. The APT voltage $V_{CC}$, which equals a sum of the modulated voltage $V_{AMP}$ and the offset voltage $V_{OFF}$, will settle at the future voltage level $V_{CC(N)}$ at time $T_3$. Notably, since the voltage amplifier 32 maintains the modulated voltage $V_{AMP}$ at or above the headroom voltage $V_{NHEAD}$ while the bypass switch $S_{BYP}$ is toggled, the APT voltage $V_{CC}$ will not drop below the headroom voltage $V_{NHEAD}$, thus ensuring proper operation of the power amplifier circuit 28.

FIG. 5 is a timing diagram providing an exemplary illustration as to how the PMIC 24 of FIG. 2 operates under another possibility of the above-described operating scenario to decrease the APT voltage $V_{CC}$. More specifically, FIG. 5 illustrates a situation where the headroom voltage $V_{NHEAD}$ (e.g., 0.4 V) is higher than or equal to the differential $\Delta V_{CC}$ (e.g., 0.1 V) between the present voltage level $V_{CC(N-1)}$ and the future voltage level $V_{CC(N)}$ ($V_{NHEAD}$≥$\Delta V_{CC}$). Elements in FIG. 2 are referenced in FIG. 5 and will not be re-described herein.

As illustrated, the transition interval TP falls completely within the present time interval $S_{N-1}$, wherein the start $T_1$ of the transition interval TP begins prior to a boundary $T_0$ between the present time interval $S_{N-1}$ and the upcoming time interval $S_N$, and the end $T_2$ of the transition interval TP is aligned with the boundary $T_0$ (a.k.a. a starting time of the CP in the upcoming time interval $S_N$). Understandably, the CP is typically much shorter than the transition interval TP. Herein, the modulated target voltage $V_{TGT}$ indicates that the APT voltage $V_{CC}$ will decrease from the present voltage level $V_{CC(N-1)}$ (e.g., 2.9 V) in the present time interval $S_{N-1}$ to the future voltage level $V_{CC(N)}$ (e.g., 2.8 V) in the upcoming time interval $S_N$. Accordingly, the control circuit 38 determines the offset target voltage $V_{TGT-OFF}$ to be equal to the future voltage level $V_{CC(N)}$.

As for the amplifier target voltage $V_{TGT-AMP}$, the control circuit 38 is configured to set the markup voltage $V_{DIFF}$ in the equation (Eq. 2) to equal the headroom voltage $V_{NHEAD}$ minus the differential $\Delta V_{CC}$ between the present voltage level $V_{CC(N-1)}$ and the future voltage level $V_{CC(N)}$ ($V_{TGT-AMP}=V_{CC(N-1)}+V_{NHEAD}-\Delta V_{CC}$). At time $T_1$, the control circuit 38 opens the bypass switch $S_{BYP}$ and activates the voltage amplifier 32 (e.g., by coupling the higher supply voltage $V_{SUPH}$ to the voltage amplifier 32). Accordingly, the voltage amplifier 32 will generate the modulated voltage $V_{AMP}$ at the input 36 in accordance with the amplifier target voltage $V_{TGT-AMP}$. In a non-limiting example, the voltage amplifier 32, with assistance from the auxiliary circuit 44, can instantly drive the modulated voltage $V_{AMP}$ from a GND level to the differential $\Delta V_{CC}$ at time $T_1$. Thereafter, the voltage amplifier 32 will continue to drive the modulated voltage $V_{AMP}$ up to the headroom voltage $V_{NHEAD}$ at time $T_2$.

Starting at time $T_1$, the offset capacitor $C_{OFF}$ is gradually discharged to reach the future voltage level $V_{CC(N)}$ at time $T_2$. Accordingly, at time $T_2$, the control circuit 38 closes the bypass switch $S_{BYP}$ and deactivates the voltage amplifier 32 to let the modulated voltage $V_{AMP}$ return to the GND level at time $T_3$. The APT voltage $V_{CC}$, which equals a sum of the modulated voltage $V_{AMP}$ and the offset voltage $V_{OFF}$, will settle at the future voltage level $V_{CC(N)}$ at time $T_3$. Notably, since the voltage amplifier 32 maintains the modulated voltage $V_{AMP}$ at or above the headroom voltage $V_{NHEAD}$ while the bypass switch $S_{BYP}$ is toggled, the APT voltage $V_{CC}$ will not drop below the headroom voltage $V_{NHEAD}$, thus ensuring proper operation of the power amplifier circuit 28.

With reference back to FIG. 2, in examples describe above, the control circuit 38 is configured to receive the modulated target voltage $V_{TGT}$ on a per time interval (a.k.a. per OFDM symbol) basis. In other words, the transceiver circuit 31 must communicate the future voltage level $V_{CC(N)}$ in the upcoming time interval $S_N$ during, or even before, the present time interval $S_{N-1}$. As previously described in FIG. 1, in a time-division duplex (TDD) system, multiple time intervals (a.k.a. OFDM symbols) can be include in a modulation unit (a.k.a. TDD time slot or mini time slot). As such, it may be possible for the control circuit 38 to receive the modulated target voltage $V_{TGT}$ on a per modulation unit (a.k.a. TDD time slot or mini time slot) basis.

In this regard, the PMIC 24 may be preconfigured to include multiple power profiles 46(1)-46(N). In a non-limiting example, the power profiles 46(1)-46(N) can be organized into a profile lookup table (LUT) 48 and stored in a memory circuit 50. The power profiles 46(1)-46(N) may be stored in the memory circuit 50 by the transceiver circuit 31 via, for example, an RF front-end (RFFE) interface (not shown).

Figures 6A, 6B:
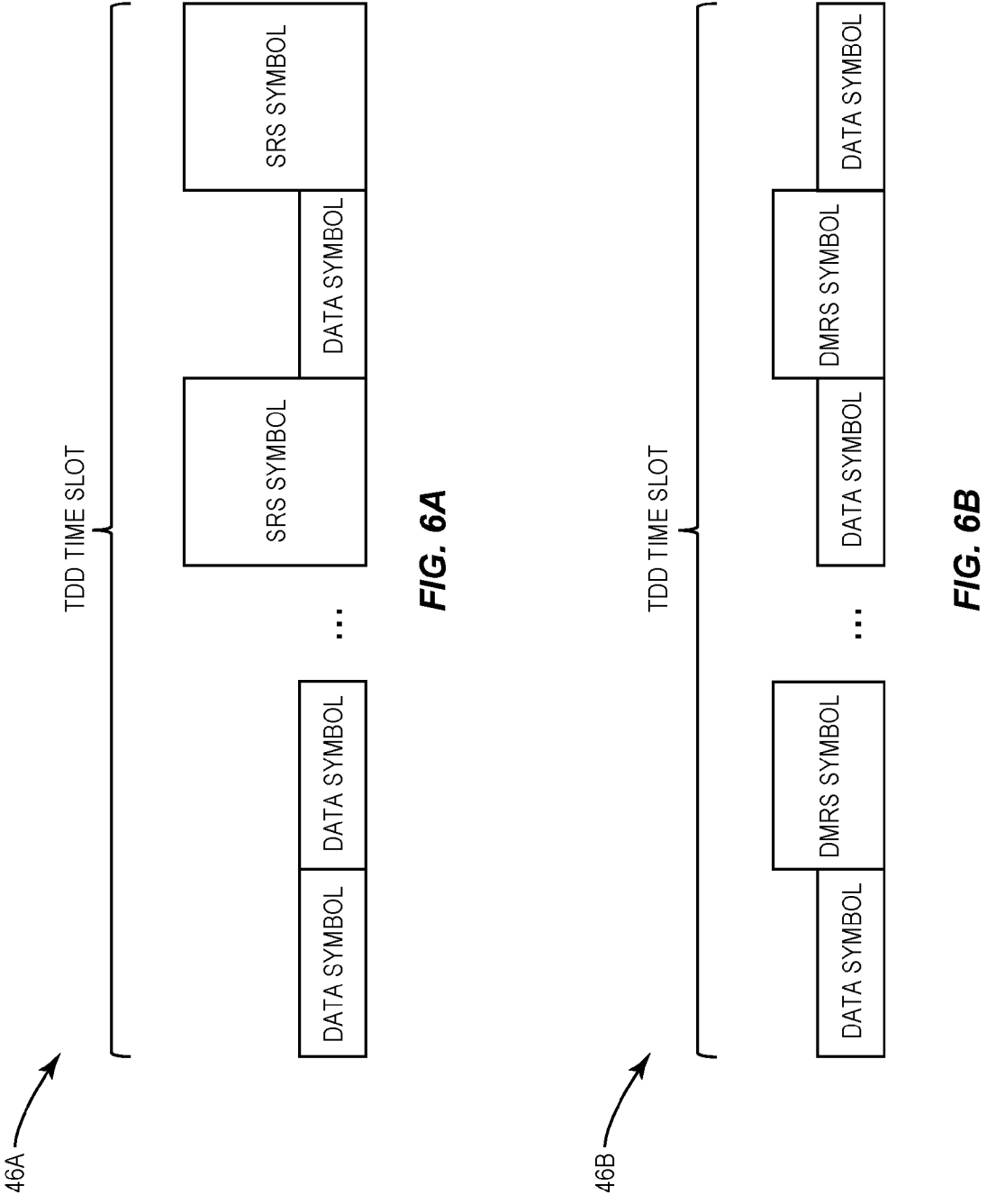
FIGS. 6A and 6B are block diagrams providing exemplary illustrations of some power profiles that may be used by the PMIC of FIG. 2 for enabling fast APT voltage switching.

FIGS. 6A and 6B are block diagrams providing exemplary illustrations of the power profiles 46(1)-46(N) that may be employed by the PMIC 24 of FIG. 2 for enabling fast switching of the APT voltage $V_{CC}$. Herein, each of the power profiles 46(1)-46(N) corresponds to a TDD time slot.

FIG. 6A shows an exemplary power profile 46A among the power profiles 46(1)-46(N). As shown, the power profile 46A may be determined to indicate the future voltage levels of one or more data symbols and one or more SRS symbols.

FIG. 6B shows an exemplary power profile 46B among the power profiles 46(1)-46(N). As shown, the power profile 46B may be determined to indicate the future voltage levels of one or more data symbols and one or more DMRS symbols.

With reference back to FIG. 2, in an embodiment, the transceiver circuit 31 may communicate a profile indication 52 to indicate a selected power profile among the power profiles 46(1)-46(N) to be used for an upcoming modulation unit (e.g., TDD time slot) during, or prior to, a present modulation unit (e.g., TDD time slot). Accordingly, the control circuit 38 may retrieve the selected power profile from the profile LUT 48 based on the received profile indication 52.

Figure 7:
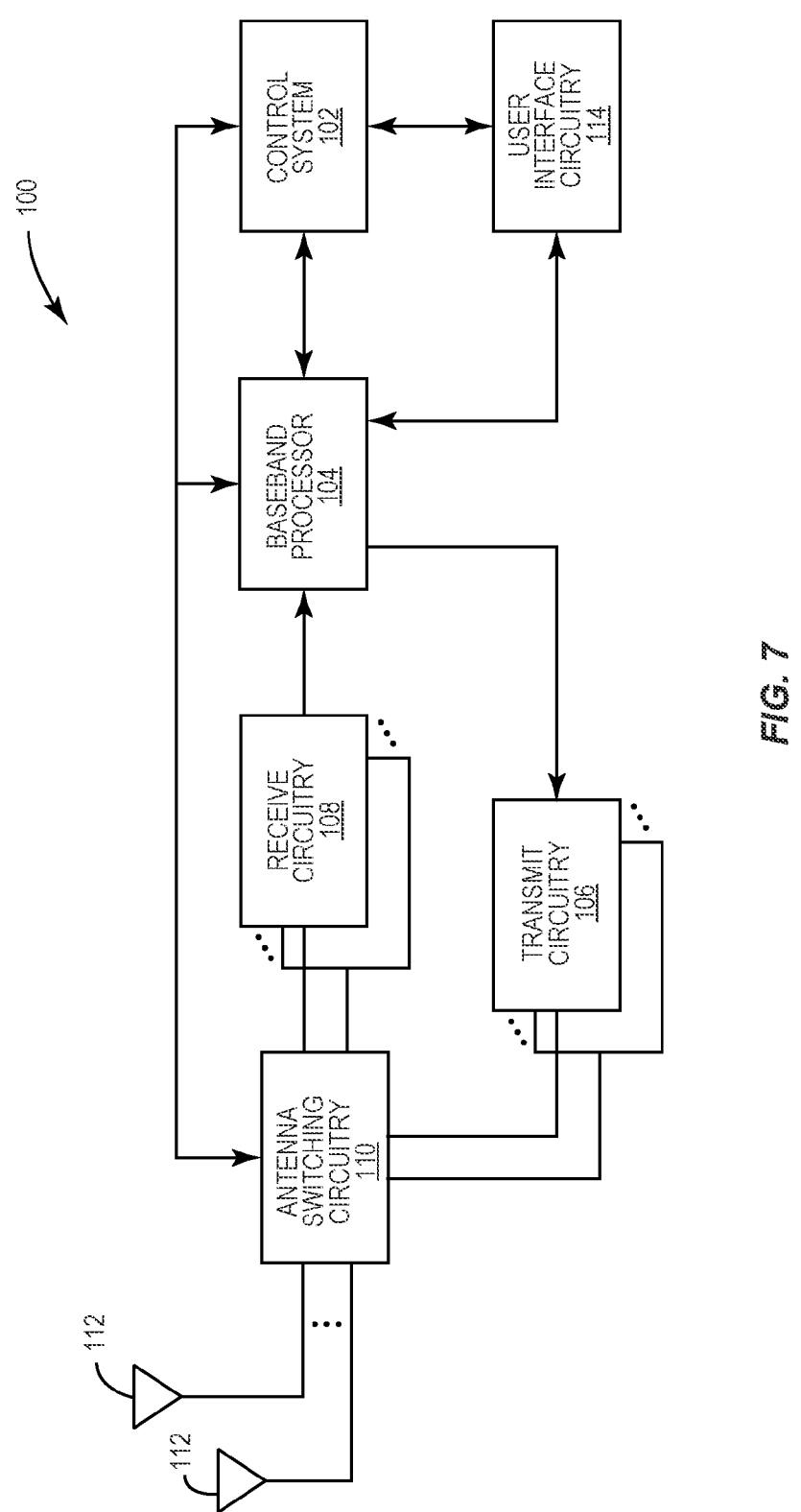
FIG. 7 is a schematic diagram of an exemplary user element wherein the PMIC of FIG. 2 can be provided.

The PMIC 24 of FIG. 2 can be provided in a user element to enable fast voltage switching. FIG. 7 is a schematic diagram of an exemplary user element 100 wherein the PMIC of FIG. 2 can be provided.

Herein, the user element 100 can be any type of user elements, such as mobile terminals, smart watches, tablets, computers, navigation devices, access points, and like wireless communication devices that support wireless communications, such as cellular, wireless local area network (WLAN), Bluetooth, and near field communications. The user element 100 will generally include a control system 102, a baseband processor 104, transmit circuitry 106, receive circuitry 108, antenna switching circuitry 110, multiple antennas 112, and user interface circuitry 114. In a non-limiting example, the control system 102 can be a field-programmable gate array (FPGA), as an example. In this regard, the control system 102 can include at least a microprocessor(s), an embedded memory circuit(s), and a communication bus interface(s). The receive circuitry 108 receives radio frequency signals via the antennas 112 and through the antenna switching circuitry 110 from one or more base stations. A low noise amplifier and a filter cooperate to amplify and remove broadband interference from the received signal for processing. Downconversion and digitization circuitry (not shown) will then downconvert the filtered, received signal to an intermediate or baseband frequency signal, which is then digitized into one or more digital streams using analog-to-digital converter(s) (ADC).

The baseband processor 104 processes the digitized received signal to extract the information or data bits conveyed in the received signal. This processing typically comprises demodulation, decoding, and error correction operations, as will be discussed in greater detail below. The baseband processor 104 is generally implemented in one or more digital signal processors (DSPs) and application specific integrated circuits (ASICs).

For transmission, the baseband processor 104 receives digitized data, which may represent voice, data, or control information, from the control system 102, which it encodes for transmission. The encoded data is output to the transmit circuitry 106, where a digital-to-analog converter(s) (DAC) converts the digitally encoded data into an analog signal and a modulator modulates the analog signal onto a carrier signal that is at a desired transmit frequency or frequencies. A power amplifier will amplify the modulated carrier signal to a level appropriate for transmission, and deliver the modulated carrier signal to the antennas 112 through the antenna switching circuitry 110. The multiple antennas 112 and the replicated transmit and receive circuitries 106, 108 may provide spatial diversity. Modulation and processing details will be understood by those skilled in the art.

Those skilled in the art will recognize improvements and modifications to the preferred embodiments of the present disclosure. All such improvements and modifications are considered within the scope of the concepts disclosed herein and the claims that follow.

What is claimed is:

1. A power management integrated circuit (PMIC) comprising:

a voltage output that outputs an average power tracking (APT) voltage to a power amplifier circuit for amplifying a radio frequency (RF) signal modulated in a plurality of modulation units each comprising a plurality of time intervals;

an offset circuit coupled to the voltage output and configured to change the APT voltage from a present voltage level in a present time interval among the plurality of time intervals to a future voltage level in an upcoming time interval among the plurality of time intervals during a transition interval that falls within one of the present time interval and the upcoming time interval; and a voltage amplifier coupled to an input of the offset circuit, the voltage amplifier is activated at a start of the transition interval and deactivated at an end of the transition interval to generate a modulated voltage at the input of the offset circuit based on an amplifier target voltage determined to cause the modulated voltage to be higher than or equal to a headroom voltage at the end of the transition interval.

2. The PMIC of claim 1, further comprising a control circuit configured to:

determine the start and the end of the transition interval based on the present voltage level and the future voltage level of the APT voltage;

determine the amplifier target voltage to be equal to a sum of the future voltage level and a markup voltage;

activate the voltage amplifier at the start of the transition interval; and deactivate the voltage amplifier at the end of the transition interval.

3. The PMIC of claim 2, wherein the control circuit is further configured to:

determine that the future voltage level of the APT voltage is higher than the present voltage level of the APT voltage;

determine the start of the transition interval to be at a boundary between the present time interval and the upcoming time interval;

determine the end of the transition interval to be later than the boundary between the present time interval and the upcoming time interval;

determine the markup voltage to be equal to the headroom voltage; and cause the offset circuit to increase the APT voltage from the present voltage level to the future voltage level by the end of the transition interval.

4. The PMIC of claim 2, wherein the control circuit is further configured to:

determine that the future voltage level of the APT voltage is lower than the present voltage level of the APT voltage and the headroom voltage is lower than a differential between the present voltage level and the future voltage level;

determine the start of the transition interval to be earlier than a boundary between the present time interval and the upcoming time interval;

determine the end of the transition interval to be at the boundary between the present time interval and the upcoming time interval;

determine the markup voltage to be equal to zero; and cause the offset circuit to decrease the APT voltage from the present voltage level to the future voltage level by the end of the transition interval.

5. The PMIC of claim 2, wherein the control circuit is further configured to:

determine that the future voltage level of the APT voltage is lower than the present voltage level of the APT voltage and the headroom voltage is higher than or equal to a differential between the present voltage level and the future voltage level;

determine the start of the transition interval to be earlier than a boundary between the present time interval and the upcoming time interval;

determine the end of the transition interval to be at the boundary between the present time interval and the upcoming time interval;

determine the markup voltage to be equal to the headroom voltage subtracted by the differential between the present voltage level and the future voltage level; and cause the offset circuit to decrease the APT voltage from the present voltage level to the future voltage level by the end of the transition interval.

6. The PMIC of claim 2, wherein the control circuit is further configured to receive, during the present time interval, an indication that indicates the future voltage level of the APT voltage in the upcoming time interval.

7. The PMIC of claim 2, wherein the control circuit is further configured to receive, during a present one of the plurality of modulation units, a profile indication that indicates a selected power profile for an upcoming one of the plurality of modulation units, the selected power profile comprises a plurality of future voltage levels each corresponding to a respective one of the plurality of time intervals in the upcoming one of the plurality of modulation units.

8. The PMIC of claim 7, further comprising a memory circuit configured to store a profile lookup table (LUT) comprising a plurality of predetermined power profiles, wherein the control circuit is further configured to retrieve the selected power profile from the profile LUT based on the received indication.

9. The PMIC of claim 1, wherein:

the plurality of modulation units each corresponds to a time division duplex, TDD, time slot; and the plurality of time intervals in each of the plurality of modulation units corresponds to an orthogonal frequency division multiplexing, OFDM, symbol.

10. A wireless communication circuit comprising a power management integrated circuit (PMIC) comprising:

a voltage output that outputs an average power tracking (APT) voltage for amplifying a radio frequency, RF, signal modulated in a plurality of modulation units each comprising a plurality of time intervals;

an offset circuit coupled to the voltage output and configured to change the APT voltage from a present voltage level in a present time interval among the plurality of time intervals to a future voltage level in an upcoming time interval among the plurality of time intervals during a transition interval that falls within one of the present time interval and the upcoming time interval; and a voltage amplifier coupled to an input of the offset circuit, the voltage amplifier is activated at a start of the transition interval and deactivated at an end of the transition interval to generate a modulated voltage at the input of the offset circuit based on an amplifier target voltage determined to cause the modulated voltage to be higher than or equal to a headroom voltage at the end of the transition interval.

11. The wireless communication circuit of claim 10, wherein the PMIC further comprises a control circuit configured to:

determine the start and the end of the transition interval based on the present voltage level and the future voltage level of the APT voltage;

determine the amplifier target voltage to be equal to a sum of the future voltage level and a markup voltage;

activate the voltage amplifier at the start of the transition interval; and deactivate the voltage amplifier at the end of the transition interval.

12. The wireless communication circuit of claim 11, wherein the control circuit is further configured to:

determine that the future voltage level of the APT voltage is higher than the present voltage level of the APT voltage;

determine the start of the transition interval to be at a boundary between the present time interval and the upcoming time interval;

determine the end of the transition interval to be later than the boundary between the present time interval and the upcoming time interval;

determine the markup voltage to be equal to the headroom voltage; and cause the offset circuit to increase the APT voltage from the present voltage level to the future voltage level by the end of the transition interval.

13. The wireless communication circuit of claim 11, wherein the control circuit is further configured to:

determine that the future voltage level of the APT voltage is lower than the present voltage level of the APT voltage and the headroom voltage is lower than a differential between the present voltage level and the future voltage level;

determine the start of the transition interval to be earlier than a boundary between the present time interval and the upcoming time interval;

determine the end of the transition interval to be at the boundary between the present time interval and the upcoming time interval;

determine the markup voltage to be equal to zero; and cause the offset circuit to decrease the APT voltage from the present voltage level to the future voltage level by the end of the transition interval.

14. The wireless communication circuit of claim 11, wherein the control circuit is further configured to:

determine that the future voltage level of the APT voltage is lower than the present voltage level of the APT voltage and the headroom voltage is higher than or equal to a differential between the present voltage level and the future voltage level;

determine the start of the transition interval to be earlier than a boundary between the present time interval and the upcoming time interval;

determine the end of the transition interval to be at the boundary between the present time interval and the upcoming time interval;

determine the markup voltage to be equal to the headroom voltage subtracted by the differential between the present voltage level and the future voltage level; and cause the offset circuit to decrease the APT voltage from the present voltage level to the future voltage level by the end of the transition interval.

15. The wireless communication circuit of claim 11, wherein the control circuit is further configured to receive, during the present time interval, an indication that indicates the future voltage level of the APT voltage in the upcoming time interval.

16. The wireless communication circuit of claim 11, wherein the control circuit is further configured to receive, during a present one of the plurality of modulation units, a profile indication that indicates a selected power profile for an upcoming one of the plurality of modulation units, the selected power profile comprises a plurality of future voltage levels each corresponding to a respective one of the plurality of time intervals in the upcoming one of the plurality of modulation units.

17. The wireless communication circuit of claim 16, wherein the PMIC further comprises a memory circuit configured to store a profile lookup table, LUT, comprising a plurality of predetermined power profiles, wherein the control circuit is further configured to retrieve the selected power profile from the profile LUT based on the received indication.

18. The wireless communication circuit of claim 10, wherein:

the plurality of modulation units each corresponds to a time division duplex (TDD) time slot; and the plurality of time intervals in each of the plurality of modulation units corresponds to an orthogonal frequency division multiplexing (OFDM) symbol.

19. The wireless communication circuit of claim 10, further comprising a transceiver circuit configured to:

generate the RF signal and modulate the RF signal in the plurality of modulation units each comprising the plurality of time intervals; and provide a modulated target voltage to the PMIC to indicate the future voltage level in the upcoming time interval among the plurality of time intervals.

20. The wireless communication circuit of claim 10, further comprising a power amplifier circuit configured to amplify the RF signal in each of the plurality of time intervals based on the APT voltage.

21. A method for fast switching an average power tracking (APT) voltage in a power management integrated circuit (PMIC) comprising:

outputting the APT voltage for amplifying a radio frequency (RF) signal modulated in a plurality of modulation units each comprising a plurality of time intervals;

changing the APT voltage from a present voltage level in a present time interval among the plurality of time intervals to a future voltage level in an upcoming time interval among the plurality of time intervals during a transition interval that falls within one of the present time interval and the upcoming time interval; and activating a voltage amplifier at a start of the transition interval and deactivating the voltage amplifier at an end of the transition interval to generate a modulated voltage based on an amplifier target voltage determined to cause the modulated voltage to be higher than or equal to a headroom voltage at the end of the transition interval.

22. The method of claim 21, further comprising:

determining the start and the end of the transition interval based on the present voltage level and the future voltage level of the APT voltage;

determining the amplifier target voltage to be equal to a sum of the future voltage level and a markup voltage;

activating the voltage amplifier at the start of the transition interval; and deactivating the voltage amplifier at the end of the transition interval.

23. The method of claim 22, further comprising:

determining that the future voltage level of the APT voltage is higher than the present voltage level of the APT voltage;

determining the start of the transition interval to be at a boundary between the present time interval and the upcoming time interval;

determining the end of the transition interval to be later than the boundary between the present time interval and the upcoming time interval;

determining the markup voltage to be equal to the headroom voltage; and increasing the APT voltage from the present voltage level to the future voltage level by the end of the transition interval.

24. The method of claim 22, further comprising:

determining that the future voltage level of the APT voltage is lower than the present voltage level of the APT voltage and the headroom voltage is lower than a differential between the present voltage level and the future voltage level;

determining the start of the transition interval to be earlier than a boundary between the present time interval and the upcoming time interval;

determining the end of the transition interval to be at the boundary between the present time interval and the upcoming time interval;

determining the markup voltage to be equal to zero; and decreasing the APT voltage from the present voltage level to the future voltage level by the end of the transition interval.

25. The method of claim 22, further comprising:

determining that the future voltage level of the APT voltage is lower than the present voltage level of the APT voltage and the headroom voltage is higher than or equal to a differential between the present voltage level and the future voltage level;

determining the start of the transition interval to be earlier than a boundary between the present time interval and the upcoming time interval;

determining the end of the transition interval to be at the boundary between the present time interval and the upcoming time interval;

determining the markup voltage to be equal to the headroom voltage subtracted by the differential between the present voltage level and the future voltage level; and decreasing the APT voltage from the present voltage level to the future voltage level by the end of the transition interval.

26. The method of claim 22, further comprising receiving, during the present time interval, an indication that indicates the future voltage level of the APT voltage in the upcoming time interval.

27. The method of claim 22, further comprising receiving, during a present one of the plurality of modulation units, a profile indication that indicates a selected power profile for an upcoming one of the plurality of modulation units, the selected power profile comprises a plurality of future voltage levels each corresponding to a respective one of the plurality of time intervals in the upcoming one of the plurality of modulation units.

28. The method of claim 27, further comprising:

storing a profile lookup table (LUT) comprising a plurality of predetermined power profiles; and retrieving the selected power profile from the profile LUT based on the received indication.

29. The method of claim 21, wherein:

the plurality of modulation units each corresponds to a time division duplex (TDD) time slot; and the plurality of time intervals in each of the plurality of modulation units corresponds to an orthogonal frequency division multiplexing (OFDM) symbol.

\* \* \* \* \*